(12) United States Patent
Kim

(10) Patent No.: US 7,633,791 B2
(45) Date of Patent: Dec. 15, 2009

(54) READ-WRITE CIRCUIT FOR SHORT BIT LINE DRAM

(76) Inventor: Juhan Kim, 5890 W. Walbrook Dr., San Jose, CA (US) 95129

( * ) Notice: Subject to any disclaimer, the term of this patent is extended or adjusted under 35 U.S.C. 154(b) by 0 days.

(21) Appl. No.: 12/417,594

(22) Filed: Apr. 2, 2009

(65) Prior Publication Data

US 2009/0190415 A1 Jul. 30, 2009

Related U.S. Application Data

(63) Continuation of application No. 12/276,315, filed on Nov. 22, 2008, now Pat. No. 7,551,474, and a continuation of application No. 11/877,044, filed on Oct. 23, 2007, now Pat. No. 7,443,714.

(51) Int. Cl.
*G11C 11/24* (2006.01)
(52) U.S. Cl. ............. 365/149; 365/189.15; 365/189.16; 365/189.17; 365/194; 365/207
(58) Field of Classification Search ................. 365/149, 365/189.15, 189.16, 189.17, 194, 207
See application file for complete search history.

(56) References Cited

U.S. PATENT DOCUMENTS 5,715,189 A 2/1998 Asakura 6,426,905 B1 7/2002 Dennard et al.
6,456,521 B1 9/2002 Hsu et al.
2003/0103368 A1 * 6/2003 Arimoto et al. ............... 365/63

OTHER PUBLICATIONS

A hierarchical bit-line architecture with flexible redundancy and block compare test for 256 Mb DRAM in VLSI Circuits, Digest of Technical Papers, May 1993.
A 322 MHz Random-Cycle Embedded DRAM With High-Accuracy Sensing and Tuning, IEEE Journal of Solid-State Circuits, vol. 40, No. 11, Nov. 2005.
A 500MHz Random Cycle 1.5ns-Latency, SOI Embedded DRAM Macro Featuring a 3T Micro Sense Amplifier, IEEE International Solid-State Circuits Conference, pp. 486, 2007.

* cited by examiner

*Primary Examiner*—Hoai V Ho

(57) ABSTRACT

A read-write circuit serving as a global sense amp for SBL (short bit line) DRAM is realized, wherein the read-write circuit includes a common line, such that the common line is used for connecting a read circuit, a latch circuit, a write circuit, a left select circuit and a right select circuit in the global sense amp for transferring write data to memory cells through a local sense amp and reading a stored data from the memory cells through the local sense amp. In doing so, the common line is useful for realizing a layout more effectively within a limited pitch, and also reducing area of the layout. And the read-write circuit is efficiently connected to a local sense amp in the short bit line memory architecture for reading and writing data. In addition, alternative circuits are described for implementing the read-write circuit for the short bit line DRAM.

7 Claims, 6 Drawing Sheets

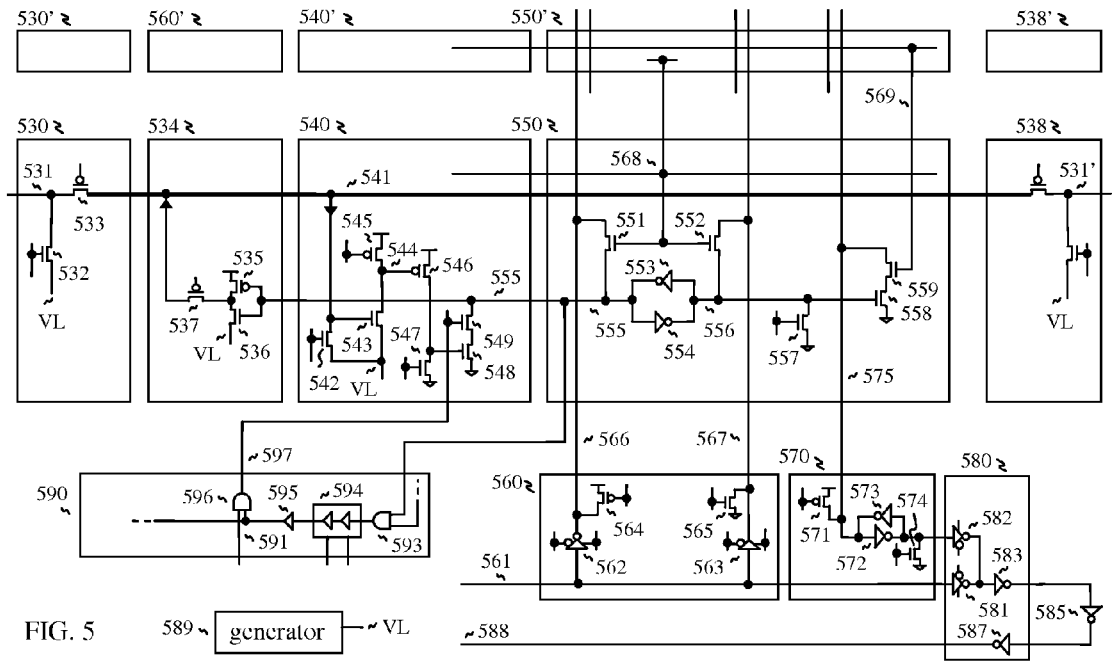
FIG. 5
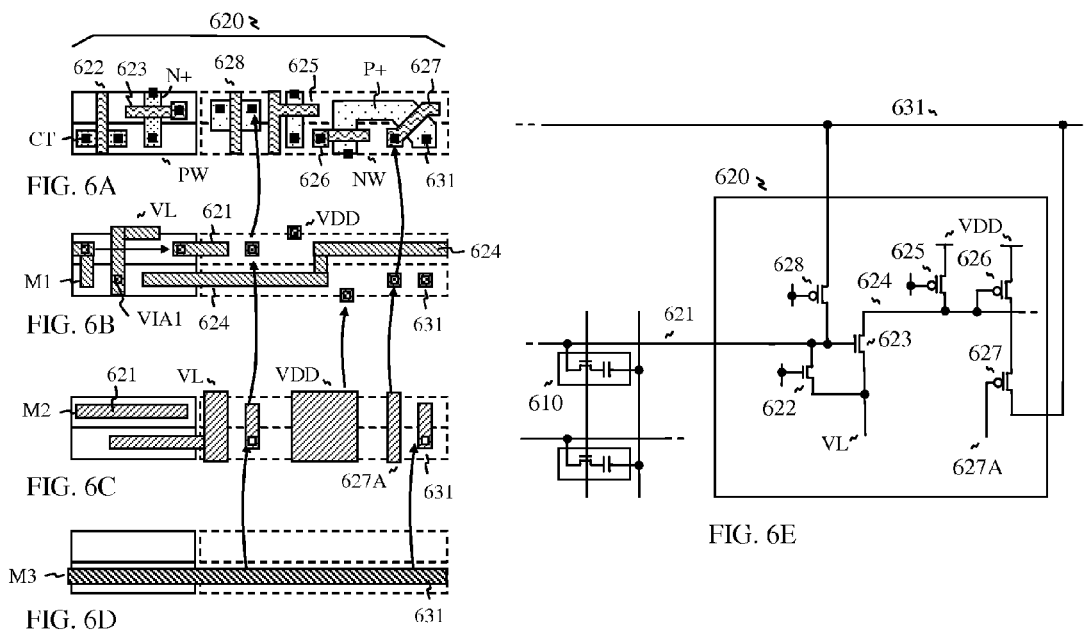
FIG. 6A
FIG. 6B
FIG. 6C
FIG. 6D
FIG. 6E

US 7,633,791 B2

READ-WRITE CIRCUIT FOR SHORT BIT LINE DRAM

CROSS REFERENCE TO RELATED APPLICATION

The present invention is a continuation of application Ser. No. 11/877,044, filed on Oct. 23, 2007, now, U.S. Pat. No. 7,443,714, and application Ser. No. 12/276,315, filed on Nov. 22, 2008 now U.S. Pat. No. 7,551,474, which are herein incorporated by reference.

FIELD OF THE INVENTION

The present invention relates generally to integrated circuits, in particular to DRAM (Dynamic Random Access Memory).

BACKGROUND OF THE INVENTION

For its high-density, the DRAM (Dynamic Random Access Memory) is utilized extensively as a main memory in computer systems, even though it requires refresh cycle to sustain stored data within a predetermined refresh time. As such, the DRAM constitutes a key component that holds sway on the performance of the computer system. Efforts of research and development have been under way primarily to boost the density and also speed improvement.

In the conventional DRAM, hierarchical bit line architecture is applied to achieve high-speed operation, as published, "Hierarchical bitline DRAM architecture system" as U.S. Pat. No. 6,456,521, and "A hierarchical bit-line architecture with flexible redundancy and block compare test for 256 Mb DRAM" in VLSI Circuits, Digest of Technical Papers, May 1993. pp 93-94. More specifically, FIG. 1 illustrates a circuit diagram of the conventional DRAM. The memory cells 101 and 102 are connected to a local bit line 131, and the memory cells 103 and 104 are connected to another local bit line 133, where the plate of capacitor is connected half VDD supply voltage typically. Local bit lines 131 and 133 are connected to a global bit line 111 and another global bit line 112 through transfer transistors 121 and 123, respectively. And more local bit lines 132 and 134 are connected to the global bit lines 111 and 112, respectively. When reading, one of memory cells is selected, and the selected cell charges or discharges the local bit line while the local bit lines and the global lines are released from pre-charge node 117, such that equalizer transistor 113, pre-charge transistors 114 and 115 are turned off by a control signal 116. Thus, one of global bit lines is also charged or discharged by the selected memory cell. After then sense amp 141 is activated to generate a read output 142. However, the selected global bit line is slowly changed because the selected memory cell should drive local bit line and global bit line through transfer transistor, where the global bit line increases total capacitance. Moreover, the storage capacitor in the memory cell should be relatively big in order to absorb the charges from the global bit line, which is one of major obstacles to reduce the DRAM cell. As a result, access time is also slow because of heavy global bit line, which increases propagation delay and sensing time for the sense amp.

And there is a prior art for improving DRAM with adding a local sense amp, as published, "High speed DRAM local bit line sense amplifier", U.S. Pat. No. 6,426,905, wherein the local sense amplifier detects a change of charge out of an input node, and comprises a first current source and a first field effect transistor. The current source is provided for removing charge from the input node. The field effect transistor includes (i) a source coupled to the input node, (ii) a gate electrode coupled to a first voltage, and (iii) a drain coupled to one side of a first capacitor, to an output node, and to a pre-charge circuit for setting the voltage of the output node to a second voltage, providing a voltage difference between the drain and source of said first transistor. The other side of the capacitor is coupled to ground. However, many transistors (total 11 transistors) for each local sense amplifier are required, such that chip area is sacrificed for the improvement.

And more prior arts are shown for dividing the bit line into short lines, "A 322 MHz Random-Cycle Embedded DRAM With High-Accuracy Sensing and Tuning", IEEE Journal of Solid-State Circuits, Vol. 40, No. 11, November, 2005, and "A 500 MHz Random Cycle 1.5 ns-Latency, SOI Embedded DRAM Macro Featuring a 3T Micro Sense Amplifier", IEEE International Solid-State Circuits Conference, pp. 486, 2007. However, those prior arts still use conventional differential sense amplifier for reading data from the memory cell. In consequence, the area of the chip is increased more, which is one of obstacles for realizing very high density and high speed memory.

Furthermore, memory cell structure of the conventional DRAM includes a cup-like capacitor as published U.S. Pat. No. 7,183,603 and a deep trench capacitor as published U.S. Pat. No. 6,608,341. Hence, scaling big storage capacitor is one of major obstacles, because total storage capacitance should be maintained around 20-30 fF for reading the memory cell through a heavy bit line and also retaining data within same or longer refresh time. In order to avoid forming the big storage capacitor, sensing scheme should be improved to read a reduced capacitor memory cell, which also should improve access time. And in order to retain data for long time even though the capacitor is reduced, leakage current of the memory cell should be reduced with sophisticated circuit techniques. In this respect, there is still a need for improving the DRAM with new circuits. More detailed explanation will be described as below.

SUMMARY OF THE INVENTION

In the present invention, read-write circuit for a short bit line (SBL) DRAM is realized, wherein the read-write circuit serves as a global sense amp for reading and writing data. And the read-write circuit includes a common line, such that the common line is used for connecting a read circuit, a latch circuit, a write circuit, a left select circuit and a right select circuit for transferring data to memory cells through multi-stage sense amps and reading a stored data from the memory cells through a select circuit. In doing so, the common line is useful for realizing a layout more effectively within a limited pitch, and also reducing area of the layout.

And the read-write circuit as the global sense amp is efficiently connected to a local sense amp in the short bit line memory architecture for reading and writing data. In order to realize the short bit line DRAM, the read-write circuit is one important circuit element. And, there are many advantages with the short bit line memory architecture including the read-write circuit. One of prime advantages is that a storage capacitor can be reduced. For example, 1 fF capacitor can be used for configuring the DRAM. For reading the 1 fF capacitor, bit line capacitance is proportionally reduced to around 1 fF by multi-dividing the bit line, which realizes fast read operation with multi-stage sense amps. When writing, the 1 fF capacitor is quickly charged by the write circuit of the global sense amp, so that write operation is improved. And write-back operation is executed by the write circuit with reduced voltage swing. With reduced swing voltage, pseudo negative word line scheme is realized for retaining the stored charges for long time. In doing so, high density DRAM can be fabricated with a large amount of logic circuits on a chip for configuring high performance system on chip, because 1 fF capacitor or below can be formed without complex capacitor forming process. On the contrary, the conventional DRAM uses a cup-like big capacitor, such as, 20~30 fF, as the storage capacitor. Hence, it is more difficult to fabricate the big capacitor on the wafer in the future, because feature size is approaching to almost scaling limit.

In order to realize the pseudo negative word line in the short bit line architecture, a pre-charge voltage VL to a local bit line and a global bit line is generated by a variable voltage generator, so that the pre-charge voltage VL is set around 0.4V for pre-charging the local bit line, for instance, while a supply voltage VDD for the pre-setting the local pre-set transistor 225 is set to 1.2V. Alternatively, the pre-charge voltage can be adjusted by setting fuse circuits, which enhances sensing margin or increasing retention time more flexibly.

For realizing high speed and low power DRAM with the small storage capacitor, bit line is multi-divided for reducing parasitic capacitance of the bit line, so that the lightly loaded bit line is quickly charged or discharge by the memory cell having the small capacitor when reading. And multi-stage sense amps are used, such that the memory cell is read by a first reduced swing amplifier serving as a local sense amp through the lightly loaded local bit line, and the local sense amp is read by a second reduced swing amplifier serving as a global sense amp through a global bit line. With multi-stage amps, fast read operation is realized. Furthermore, low power operation is realized with reduced swing amplifiers because voltage swing is reduced during operation. And also a write circuit is connected to the memory cell through the local bit line and the global bit line for limiting the voltage swing.

During read operation, a voltage difference in the local bit line is converted to a time difference for differentiating high data and low data. For example, high data is quickly transferred to an output latch circuit through the amplifiers with high gain, but low data is rejected by a locking signal based on high data as a reference signal. In this manner, time domain sensing scheme is realized to differentiate high (voltage) data and low (voltage) data. In detail, a reference signal is generated by one of fast changing data with high gain from reference cells, which signal serves as a reference signal to generate a locking signal in order to reject latching another data which is slowly changed with low gain, such that high voltage data is arrived first while low voltage data is arrived later, or low voltage data is arrived first while high voltage data is arrived later depending on configuration. The time domain sensing scheme effectively differentiates high voltage data and low voltage data with time delay control, while the conventional sensing scheme is current-domain or voltage-domain sensing scheme. In the convention memory, the selected memory cell charges or discharges the bit line, and the charged or discharged voltage of the bit line is compared by a comparator which determines an output at a time. With time domain sensing, there are many advantages to read the memory cell, so that the sensing time is easily controlled by a tunable delay circuit, which compensates cell-to-cell variation and wafer-to-wafer variation, thus there is a need for adding a delay time before locking the output latch circuit with a statistical data for all the memory cells, such as mean time between fast data and slow data. Thereby the tunable delay circuit generates a delay time for optimum range. And the read output from the memory cell is transferred to the output latch circuit through a returning read path, thus the access time is equal regardless of the location of the selected memory cell, which is advantageous to transfer the read output to the external pad at a time.

For storing the charges in the small storage capacitor within a predetermined retention time, pseudo negative word line scheme is devised, so that the word line of the memory cell is forced to ground voltage and the bit line is pre-charged to a limited voltage as a pre-charge voltage. Thus, negative word line is virtually forced for storing data "1" when a storage node voltage is charged near supply voltage because drain/source voltage to word line as a gate voltage is negative. This means that data "1" is stored under pseudo negative word line even though the word line is actually forced to ground voltage. However data "0" is rejected to be read by the locking signal in the time domain sensing scheme. In doing so, subthreshold leakage current is significantly reduced in exponential subthreshold region of a MOS transistor while storing data "1". Furthermore, back bias voltage for a pass transistor of the memory cell is not required because back bias voltage is used for avoiding forward biasing from overshoot when storing data "0", while data "1" is reversed biased from the body. Without negative biasing to the body of the pass transistor, reverse leakage current is reduced with reduced potential difference between the storage node and the body while storing data "1" for long time. And, the time domain sensing scheme can effectively reject to be read data "0".

Configuring memory is more flexible, such that multiple memory macros can be configured with small segmented memory array and multi-stage sense amps, instead of big macro with the conventional sense amp which includes differential amps, write circuits and equalization circuits. And number of sense amps can be determined by the target speed. For example, high speed application needs more segmented array with more sense amps, while high density application needs more memory cells with reduced number of sense amps, thus cell efficiency is increased.

And, the local sense amp has high gain with wider channel MOS transistor than that of the memory cell. Hence, the stored data in the memory cell is quickly transferred to the latch in the global sense amp. After then, the data transfer circuit transfers a read output to data output node through buffers, which realizes fast read operation with no extra waiting time.

A buffered data path is connected to the global sense amp for writing and reading a data, wherein a write line serving as a forwarding write path is used for writing, such that the forwarding write path is selected by block select signals, which realizes to reduce driving current and RC time constant, because unselected portion of the data line is not charging or discharging when writing. Furthermore, unselected portion of the data line is used as a returning read path. Thus, the returning read path receives a read output from the memory cell through multi-stage sense amps. And the returning read path is also buffered and connected to data output node through multiple buffers. With the returning read path, access time is almost same regardless of selected memory cell location, which realizes to latch the read output at a time with enough set-up and hold time even though a latch clock is fixed.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

FIG. 5 illustrates an alternative configuration with NMOS pull-down transistors for connecting to the global latch node, according to the teachings of the present invention.

FIGS. 6A, 6B, 6C and 6D illustrate alternative layout for the local sense amp including a PMOS write transistor and FIG. 6E illustrates the related local sense amp circuit for explaining the layout, according to the teachings of the present invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
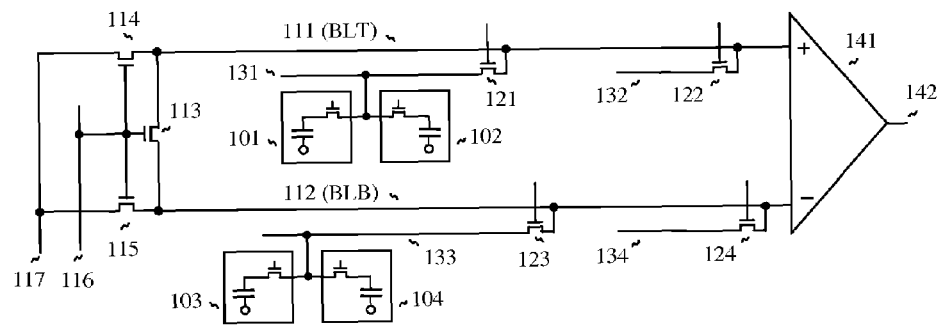
FIG. 1 illustrates a dynamic random access memory, as a prior art.
Figure 2A:
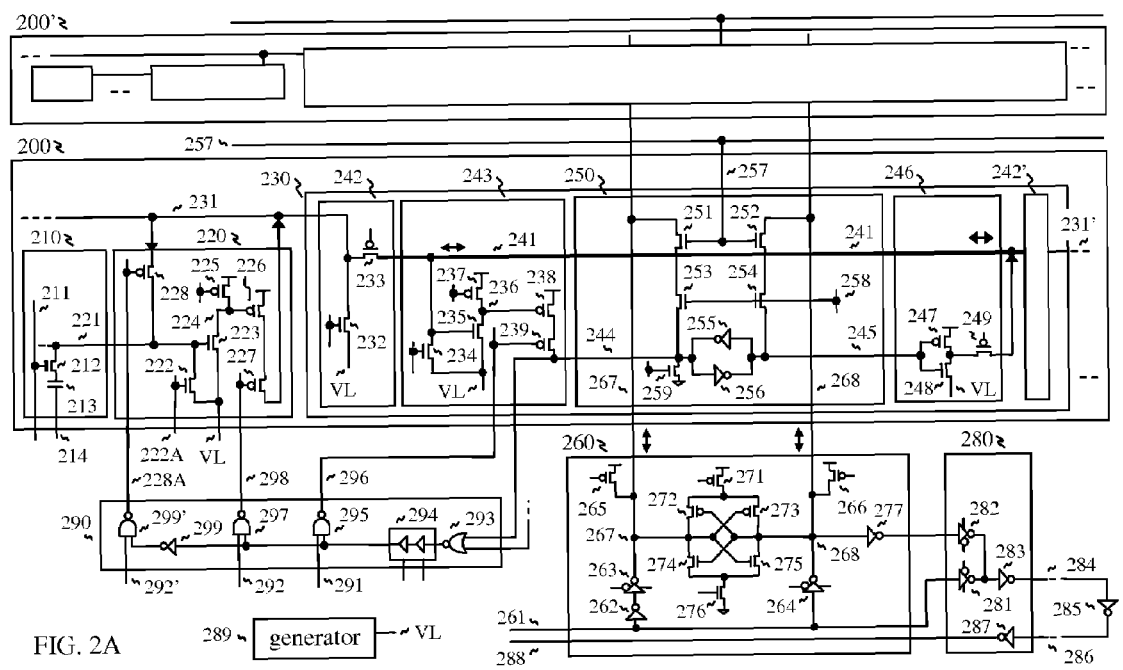
FIG. 2A illustrates a short bit line DRAM including a read-write circuit as the present invention.

The present invention is directed to a read-write circuit for short bit line DRAM as shown in FIG. 2A, wherein a memory block 200 comprises a memory cell 210, a local sense amp 220, and a global sense amp 230 which serves as the read-write circuit. The memory cell 210 is composed of a pass transistor 212 and a reduced storage capacitor 213 which is connected to a plate line 214. And a word line 211 is connected to the pass transistor 212, and the local sense amp 220 is connected to the memory cell 210 through a local bit line 221. In the short bit line architecture, reduced numbers of memory cells are connected to the local bit line for reducing parasitic capacitance, such as 16 cells, 24 cells, 32 cells, 48 cells, 64 cells and 128 cells, while 256 cells and 512 cells are connected to a bit line in the conventional DRAM. In doing so, the storage capacitor is proportionally reduced, such that the local bit line capacitance is smaller or similar to the storage capacitance because small local sense amps can be repeatedly inserted into the memory cell array while the conventional differential sense amp is too big to insert into the memory cell array.

The local sense amp 220 is composed of a local pre-charge transistor 222 for pre-charging the local bit line 221 to a pre-charge voltage VL, a local pre-amp transistor 223 for connecting to a local pre-amp node 224, a local pre-set transistor 225 for pre-setting the local pre-amp node 224, a local main-amp transistor 226 for reading to the local pre-amp node 224 when a local amp enable transistor 227 is enabled; and a write transistor 228 is connected to the local bit line 221 for connecting to a global bit line 231.

The local pre-amp transistor 223 detects whether the local bit line 221 is higher than the pre-charge voltage VL or not. When reading, the local pre-amp transistor 223 is used as a pre amplifier for discharging the local pre-amp node 224 which is very lightly loaded, and the local main-amp transistor 226 pulls up the global bit line 231 connecting to the global sense amp 230. And the pre-charge voltage VL is generated by a variable voltage generator 289, so that the voltage VL is set around 0.4V for pre-charging the local bit line, for instance, while a supply voltage VDD for the pre-setting the local pre-set transistor 225 is set to 1.2V.

And the global sense amp 230 serves as the read-write circuit, wherein the read-write circuit includes a common line 241 for connecting to its component circuits having a read circuit 243, a latch circuit 250, a write circuit 246, and at least a select circuit comprising a left select circuit 242 and/or a right select circuit 242', such that the read circuit 243 includes a common pre-charge transistor 234 for pre-charging the common line 241 to the pre-charge voltage VL, a global pre-amp transistor 235 for reading the common line 241, a global pre-set transistor 237 for pre-setting a global pre-amp node 236 connecting to the global pre-amp transistor 235, and a global main-amp transistor 238 for reading to the global pre-amp node 236 when a global amp enable transistor 239 is enabled. And the latch circuit 250 includes a cross coupled inverter latch having inverters 255 and 256 for connecting a pair of latch nodes, a latch reset transistor 259 for resetting left latch node 244, and a pair of series transistors having a row select transistor pair 253 and 254 for connecting to the pair of the latch nodes and a column select transistor pair 251 and 252 for connecting to a pair of data lines 267 and 268. And the write circuit 246 includes an inverter receiving a voltage output of right latch node 245, and a write enable transistor 249 receiving an output of the inverter and driving the common line 241, where the inverter is composed of a pull-up transistor 247 and a pull-down transistor 248 which is supplied by the variable voltage source from the variable voltage regulator 289. And the left select circuit 242 is composed of a global pre-charge transistor 232 for pre-charging the global bit line 231 to the pre-charge voltage VL and a global select transistor 233 for connecting the global bit line 231 to the common line 241 in the left hand side. And, the right select circuit 242' is composed of the same circuit as the left select circuit 242 for connecting a right global bit line 231' to the common line 241 in the right hand side.

And the global amp enable transistor 239 is connected to a locking signal 296, such that the global amp enable transistor 539 is disabled after a read output from the memory cell is reached to the latch circuit 250. And the locking signal 296 is generated by a locking signal generator 290, wherein the locking signal generator 290 is composed of a NOR gate 293 for receiving an output from the latch circuit 250, a tunable delay circuit 294 (as shown in FIG. 6A) for delaying the read output of the latch circuit 250, and a NAND gate 295 for generating the locking signal 296, while a global read enable signal 291 is asserted to high. Another locking signal 298 is generated by another NAND gate 298 receiving the delayed output, in order to disable the local amp enable transistor 227 while a local read enable signal 292 is asserted to high. And the locking signal 296 and 298 are generated as long as one of reference memory cells works correctly. And a local write enable signal 228A is generated by a NAND gate 299' and an inverter 299 after locking, when a write enable signal 292' is asserted to high during write-back operation or a write operation.

During read operation, a stored data in the memory cell 210 is transferred to the latch circuit 250 through the sense amps, for instance, high data is transferred to the latch circuit by the local sense amp and the global sense amp with high gain, but low data is not transferred with low gain because the global amp enable transistor 239 connecting to the latch circuit 250 is disabled by the locking signal 296 which is based on high data, before low data is arrived. Furthermore, the latch circuit is also used for write-back operation when the memory cell is accessed because the stored data in the memory cell 210 is destructed by the charges of the local bit line 221 when reading.

After the stored data is reached to the latch circuit 250, a row select signal 258 and a column select signal 257 are asserted to high, so that the read output is transferred to the data line sense amp 260 through the data line pair 267 and 268. When reading data "1", a positive latch node 244 is raised to high from a pre-charge state with the latch reset transistor 259 by the read circuit 243, which does not discharge the positive data line 267, but a negative data line 268 is discharged to VSS voltage because a negative latch node 245 is discharged when the read circuit 243 pulls up the positive latch node 244, while the data lines 267 and 268 are released from the pre-charge transistors 265 and 266. The row enable transistor pair 253 and 254 is disabled by the roe select signal 258 for avoiding a conflict in unselected memory block (not shown), because the positive latch node 244 is reset to VSS voltage for unselected memory block, while the data line 267 is pre-charged to supply voltage VDD. Thereby, unnecessary current flow is avoided for the unselected memory block during operation.

After then, the data line sense amp 260 is activated by turning on a pull-up transistor 271 and a pull-down transistor 276, such that PMOS transistor 272 and NMOS transistor 275 are turned on, while PMOS transistor 273 and NMOS transistor 274 are turned off, when reading data "1". The data line sense amp 260 accelerates discharging the data line 268. By discharging the negative data line 268, output data 288 is changed to high through inverting buffers including 277, 282, 283, 285 and 287, because the data select circuit 280 selects a read tri-state inverter 282 for transferring the read output, while a bypass tri-state inverter 281 is turned off. And there are as many as memory blocks (not shown) in a chip, so that unselected memory blocks select the bypass tri-state inverter for transferring the read output to data output node. On the contrary, when reading data "0", the positive data line 267 is discharged but the negative data line 268 is not changed from the pre-charge state, Hence, the data out 288 keeps low.

And the read output is buffered by multiple inverting buffers 277, 282, 283, 285 and 287 including a forwarding read line 284 and a returning read line 286. With the returning read path, access time is almost same regardless of selected memory cell location, which realizes to latch the read output at a time with enough set-up and hold time even though a latch clock is fixed.

In the present invention, the local sense amp need not reference bit line because the local sense amp does not compare voltage or current with reference bit line, but the local sense amp detects whether the local pre-amp transistor 223 is turned on or not by the selected memory cell through the local bit line 221. Additionally, the local pre-amp transistor 223 and the global pre-amp transistor 235 can be composed of a low threshold MOS transistor as an alternative configuration for high speed application. Alternatively, the write transistor 228 can be composed of a low threshold MOS transistor as well for reducing threshold voltage drop.

For writing data, two write tri-state inverters 263 and 264 are turned on for driving the data line pair 267 and 268 respectively, while the data line sense amp 260 is de-activated by turning off pull-up transistor 271 and pull-down transistor 276, and the pre-charge transistors 265 and 266 are turned off as well. Thereby, write data is transferred to the latch circuit 250 through forwarding write line 261 and the two write tri-state inverters 263 and 264 with an inverter 262 for the positive data line 267. And then, the write data in the latch circuit is transferred to the memory cell through the write circuit 246, when the write enable transistor 249, the global select transistor 233 in the global sense amp 230 and the write transistor 228 in the local sense amp 220 are turned on. When writing data, the word line 211 is asserted to higher than VDD+VT voltage for avoiding NMOS threshold voltage drop where VDD is a supply voltage and VT is threshold voltage of the MOS transistor. During write operation, the local amp enable transistor 227 and the global amp enable transistor 239 are disabled for transferring the write data to the memory cell through the local bit line 221 and the global bit line 231. And swing voltage of the global bit line and the local bit line is limited by forcing a source of a pull-down transistor 248 of the write circuit 246 to the pre-charge voltage VL when writing data "0" while a supply voltage VDD is forced to the pull-up transistor 247 when writing data "1".

Figure 2B:
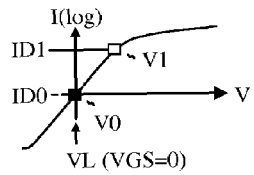
FIG. 2B illustrates an I-V curve of the local pre amplifier of the local sense amp when reading.

Referring now to FIG. 2B in view of FIG. 2A, I-V curve of the local pre-amp transistor 223 is illustrated in logarithmic scale when reading. When the memory cell 210 stores data "1", the local bit line 221 is raised from VL voltage to V1 voltage while the local pre-charge transistor 222 is turned off by de-asserting a pre-charge signal 222A to low, and the word line 211 is asserted to a predetermined voltage. For instance, the local bit line voltage is raised from 0.4V to 0.8V when the stored voltage in the memory cell is 1.2V, where local bit line capacitance is 1 fF and the storage capacitance is 1 fF. Thereby the local pre-amp transistor 223 is turned on, which flows ID1 current, where threshold voltage VT of the local pre-amp transistor 223 is around 0.35V. Alternatively, the local pre-amp transistor 223 can be composed of low threshold MOS transistor. More accurately, the local pre-amp transistor 223 measures the voltage difference between the local bit line 221 and the VL voltage. When reading data "1", the local bit line voltage is 0.4V higher than VL voltage while threshold voltage is 0.35V, so that the local pre-amp transistor 223 can discharge the local pre-amp node 224 because the parasitic capacitance of the local pre-amp node 224 is extremely light without long routing line. As a result, the local pre-amp transistor 223 converts a voltage difference in the local bit line to a discharging time difference because the local pre-amp transistor 223 flows current ID1 as shown in FIG. 2B. Hence, the local sense amp can compare the data "1" and data "0" in subthreshold region, which is relative comparison.

On the contrary, when the memory cell 210 stores data "0", the local bit line 221 keeps pre-charge voltage VL as shown V0. Thereby gate-source voltage is 0V (VGS=0V), which flows only low current ID0 through the local pre-amp transistor 223 and discharges the local pre-amp node 224 very slowly, such as thousand to million times slow. In doing so, bit line voltage is converted to current difference, and the current difference is converted to discharging time difference. And the discharging time difference between data "1" and data "0" is transferred to the global sense amp. For example, data "1" is transferred to the global sense amp much earlier than data "0". Thus, data "1" can be used as a reference signal for rejecting to be read data "0".

Figure 2C:
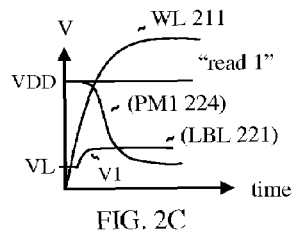
FIG. 2C illustrates waveform of the local bit line when reading data "1"

Referring now to FIG. 2C in view of FIG. 2A, waveform of the local bit line for reading data "1" is illustrated, wherein the local bit line (LBL) 221 is quickly charged to V1 voltage by raising the word line (WL) 211 to a predetermined voltage, only if the storage node of the selected memory cell stores high voltage data (data "1"). And the local pre-amp node (PM1) 224 is quickly discharged by charging the local bit line.

Figure 2D:
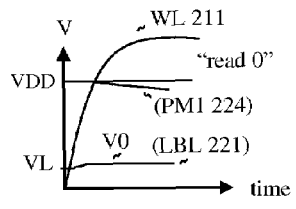
FIG. 2D illustrates waveform of the local bit line when reading data "0"

Referring now to FIG. 2D in view of FIG. 2A, waveform of the local bit line for reading data "0" is illustrated, wherein the local bit line (LBL) 221 is very slightly charged to V0 voltage by raising the word line (WL) 211 to a predetermined voltage, only if the storage node of the selected memory cell stores low voltage data (data "0"). However the local pre-amp node (PM1) 224 is not discharged or extremely slowly discharged.

Figure 2E:
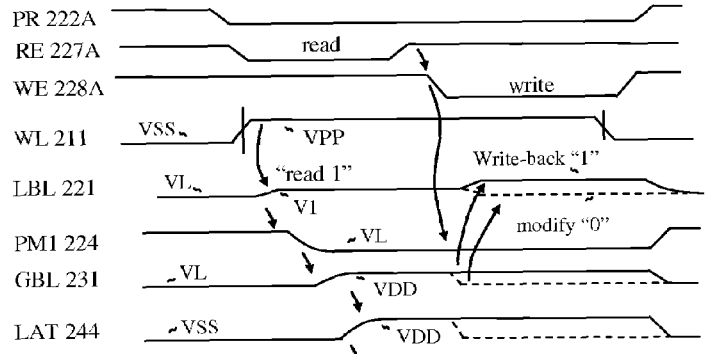
FIG. 2E illustrates timing diagram when reading data "1"

Referring now to FIG. 2E in view of FIG. 2A, detailed timing for reading data "1" is illustrated. To read data, the pre-charge (PR) signal 222A is de-asserted to low for releasing the local bit line 221, and then the word line 211 is raised to a predetermined voltage. By raising the word line, the local bit line (LBL) 221 is charged to V1 voltage from the pre-charge voltage VL, because the memory cell 210 stores high data, while the local pre-set transistor 225 and the write transistor 228 are turned off. Thus the local pre-amp transistor 223 is turned on, which discharges the local pre-amp node (PM1) 224 to VL voltage from a pre-set voltage VDD.

By discharging the local pre-amp node (PM1) 224, the local main-amp transistor 226 is turned on, which pulls up the global bit line (GBL) 231, while the local amp enable transistor 227 is turned on, but the global pre-charge transistor 232 and the write select transistor 249 are turned off. When the global bit line 231 is raised to VDD voltage from VL voltage, the latch circuit 250 is changed from the reset state by turning on the global main-amp transistor 238 when the global select transistor 233 is also turned on, but the latch reset transistor 259 is turned off, because the common line 241 is charged by the global bit line 231. And then, the read output in the latch circuit is transferred to the data lines 267 and 268, respectively, after the pre-set transistors 265 and 266 are turned off. And the data line sense amp 260 is activated to amplify the data line voltage, such that the negative data line 268 is quickly discharged while the positive data line 267 keeps high. By discharging the negative data line 268, the data output 288 is changed to high through the inverting buffers including 282, 283, 285 and 287, while the read tri-state inverter 282 is turned on but the bypass tri-state inverter 281 is turn-off state.

After reading, write-back operation is executed, such that the read data in the latch node 245 is written back to the memory cell through the write transistor 228, when a write enable signal 228A is asserted to low. Or read-modify-write operation can be executed, where broken lines in the local bit line (LBL) 221 and the global bit line (GBL) 231 illustrate to modify from data "1" to data "0", so that the local bit line 221 and the storage node (not shown) is inverted by the modified data. After write-back operation, all the control signals including the pre-charge signal (PR) 222A, the word line, and other control signals, are returned to the pre-charge state or standby mode. And, during standby, the write line 261 keeps low for pre-setting an output node of the bypass tri-state inverter 281 to high, because the bypass tri-state inverter 281 is turned on, which prevents a conflict with high data from the read tri-state inverter 282 when the memory block is activated.

Figure 2F:
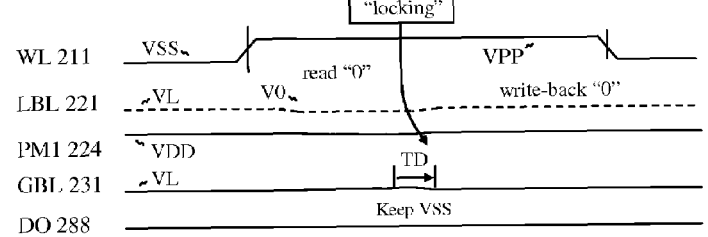
FIG. 2F illustrates timing diagram when reading data "0"

Referring now to FIG. 2F in view of FIG. 2A, detailed timing for reading data "0" is illustrated, wherein the local bit line (LBL) 221 keeps VL voltage when the stored voltage in the memory cell is near VL voltage, which keeps the local pre-amp transistor 223 on turn-off state. Thereby, the global bit line 231 keeps the pre-charge state at VL voltage, which does not change the latch circuit 250. And other read path keeps the pre-charge state. Hence the data output (DO) 288 keeps the pre-charge state at low. However, the local pre-amp node (PM1) 224 is very slowly discharged by turn-off current through the local pre-amp transistor 223. And the global bit line 231 can be charged by the turn-off current of the local main-amp transistor 226. The turn-off leakage current depends on transistor parameters, temperature and substrate voltage for the transistor. Hence, the global bit line 231 may be gradually pulled up, which may change the latch circuit 250 while the global amp enable transistor 239 is enabled. For reducing turn-off current, long channel transistors can be used for the local pre-amp transistor 223, the local main-amp transistor 226, the global pre-amp transistor 235 and the global main-amp transistor 238, while the local pre-charge transistor 222, the local pre-set transistor 225, the global pre-charge transistor 232 and the global pre-set transistor 237 can be composed of relatively short channel transistor, which helps to keep the pre-charge state when reading data "0", alternatively. In order to avoid the false flip with the leakage current when reading data "0", the global amp enable transistor 239 is turned off by the locking signal 296 which is generated by locking signal generator 290 receiving fast data (data "1") with delay time as shown TD, so that data "0" is rejected to be latched to the latch circuit because data "0" is arrived later. This means that the latch circuit 250 keeps the reset state when reading data "0", such that this operation is called locking with the locking signal. After reading data "0", the write-back operation is executed by asserting the write enable signal 228A. And then, all the control signals including the word line, the write enable signal and others are returned to the pre-charge state or standby mode.

In this manner, the locking signal 296 effectively differentiates high data and low data where the memory block 200 serves as a reference memory block storing data "1" while a main memory block 200' stores main data, so that this sensing scheme is called "time domain sensing scheme", which can differentiate high data and low data within a predetermined time domain even though the leakage current is relatively high. Thereby, data "1" in the memory cell 210 is quickly transferred to the latch circuit through the local sense amp with high gain, which generates the locking signal, but data "0" is not transferred with low gain, thus the locking signal effectively rejects data "0" not to be latched. In other words, fast cycle memory (with no page mode) does not require the locking signal which is generated by the reference signal based on reference cells storing data "1", because data "0" is not reached to the latch within a short cycle. Thus, an enable signal from a control circuit is used to control the global amp enable transistor for fast cycle operation, which does not require reference cells and related circuits. And by applying multi-divided bit line architecture, fast read operation and write operation are realized. And also the memory cell can be reduced, because the memory cell drives only lightly loaded bit line, which means that the capacitor can be reduced for realizing very high density memory.

Figure 2G:
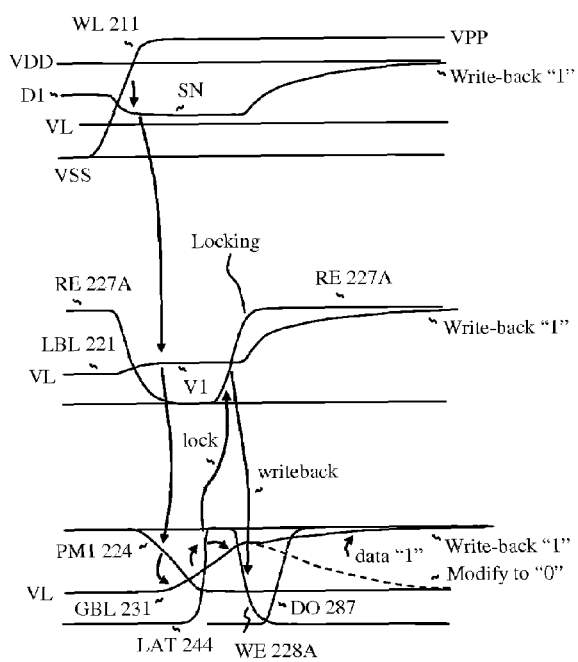
FIG. 2G illustrates simulated waveforms when reading data "1"

In FIG. 2G, simulated waveforms (which are duplicated from the SPICE simulator output with painstaking) are illustrated when reading data "1", wherein stored charges in the storage node (SN) is re-distributed with charges in the local bit line (LBL) 221 after the word line (WL) 211 is asserted to a pre-determined voltage. The local bit line (LBL) 221 is raised to V1 voltage from VL voltage, by positive charges in the storage node for data "1" (D1). For enabling the sense amps, a local enable signal (RE) 227A is asserted to low. Hence, the local pre-amp node (PM1) 224 is discharged by raising the local bit line 221 to V1 voltage, when V1 voltage is near threshold voltage of the local pre-amp transistor. By discharging the local pre-amp node 224, the global bit line (GBL) 231 is raised, which discharges the global pre-amp node (PM2) 236. And the latch node (LAT) 244 in the latch circuit 250 is changed by discharging the global pre-amp node (PM2) 236. After changing the latch node, the locking signal is generated, which locks the local sense amp and the global sense amp. And then, the write enable (WE) signal 228A is asserted for the write-back operation, which restores the read data or modifies an inverted data to the storage node (SN) of the memory cell.

Figure 2H:
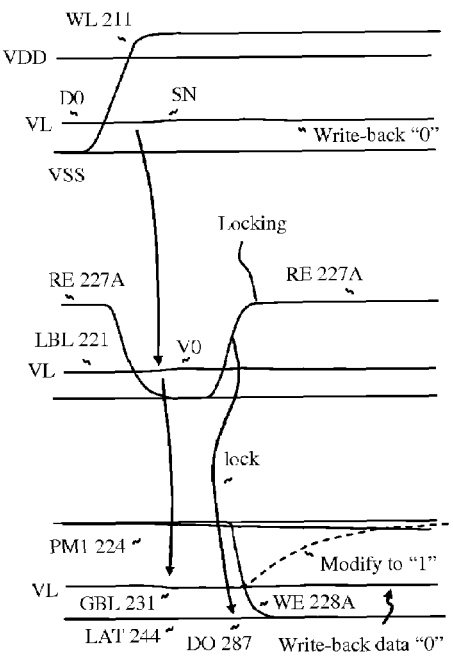
FIG. 2H illustrates simulated waveforms when reading data "0", according to the teachings of the present invention.

In FIG. 2H, simulated waveforms are illustrated when reading data "0", wherein the local bit line (LBL) 221 is slightly changed to V0 voltage from VL voltage, by negative charges in the storage node for data "0" (D0) because leakage current lowers the storage node to lower than VL voltage with reversely biased body. For enabling the sense amps, the local enable signal (RE) 227A is asserted to low. However, the local pre-amp node (PM1) 224 is not discharged because the local pre-amp transistor 223 is turned off. Thus, the global bit line (GBL) 231 is not changed. And the latch node (LAT) 244 in the latch circuit is not changed either. After then, locking operation and write-back operation are executed as reading data "1" similarly.

Figure 3A:
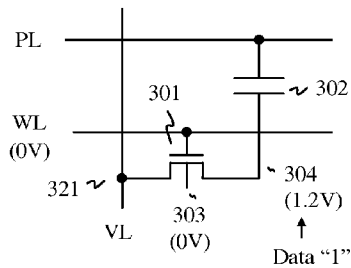
FIG. 3A illustrates a simplified schematic when storing data "1"

In FIG. 3A, a simplified schematic when storing data "1" is illustrated for explaining pseudo negative word line scheme during standby, wherein the word line (WL) of the memory cell is asserted to VSS voltage, the local bit line 321 is pre-charged to VL voltage, for example, 0.4V, and the storage node 304 is charged to VDD voltage (1.2V), when storing data "1". Thus, gate-to-source voltage of the pass transistor 301 is negative 0.4V, even though the word line is forced to ground voltage.

Figure 3C:
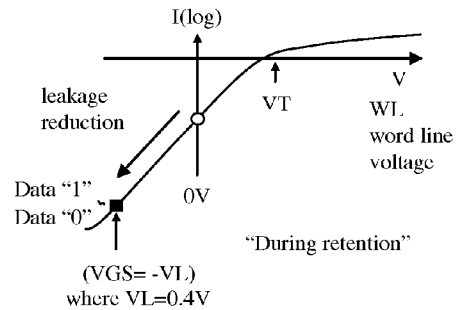
FIG. 3C illustrates subthreshold leakage current curve for the memory cell.
Figure 3B:
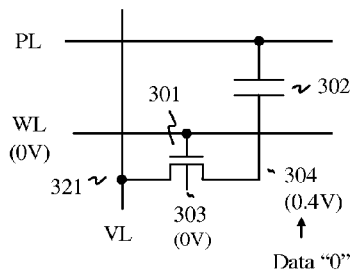
FIG. 3B illustrates a simplified schematic when storing data "0"

As shown in FIG. 3B, when storing data "0", gate-to-source voltage of the pass transistor 301 is negative 0.4V as well, while the storage node 304 is charged to VL voltage, 0.4V, and the local bit line is also charged to VL voltage.

In FIG. 3C, subthreshold leakage current curve of the pass transistor 301 is illustrated, wherein the word line voltage (WL) is negative VL voltage when storing data during standby. As a result, subthreshold leakage current through the pass transistor is exponentially reduced in exponential subthreshold region. Hence, retention time of the present invention is drastically longer than that of the conventional DRAM including 30 fF big capacitor, even though the storage capacitor is reduced to 1 fF from 30 fF. Furthermore, the body 303 of the pass transistor is forced to ground voltage. On the contrary, the body is forced to negative voltage in the conventional DRAM. With ground body potential, reverse bias leakage current is dramatically reduced in exponential reverse bias region as well. Alternatively, the voltage VL can be adjusted by a fuse circuit, which is more flexible for improving retention and sensing operation, such that retention time is increased by raising the VL voltage but sensing margin is reduced as long as a supply voltage VDD is constant. Inversely, sensing margin is increased while retention time is decreased by lowering the VL voltage.

Figure 3D:
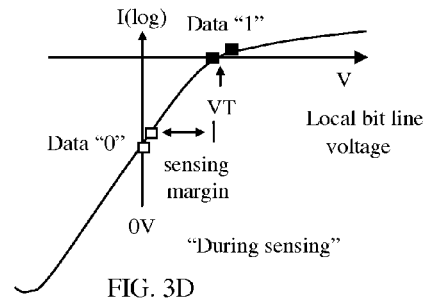
FIG. 3D illustrates I-V curve of the local pre-amp transistor, according to the teachings of the present invention.

In FIG. 3D, I-V curve of the local pre-amp transistor (223 in FIG. 2A) is illustrated. When reading data "1", local bit line voltage 221 is distributed near the threshold voltage of the local pre-amp transistor, such that strong memory cell exhibits higher voltage than threshold voltage (VT) but weak memory cell exhibits near threshold voltage (VT). In either way, data "1" is quickly transferred to the global sense amp with high gain, but data "0" is not reached without any gain, because local bit line voltage 221 is nearly distributed 0V. In doing so, sensing margin is relatively high for differentiating data "1" and data "0". Furthermore, sensing margin is controlled by the locking signal in the time-domain with the tunable delay circuit as explained above.

Figure 4:
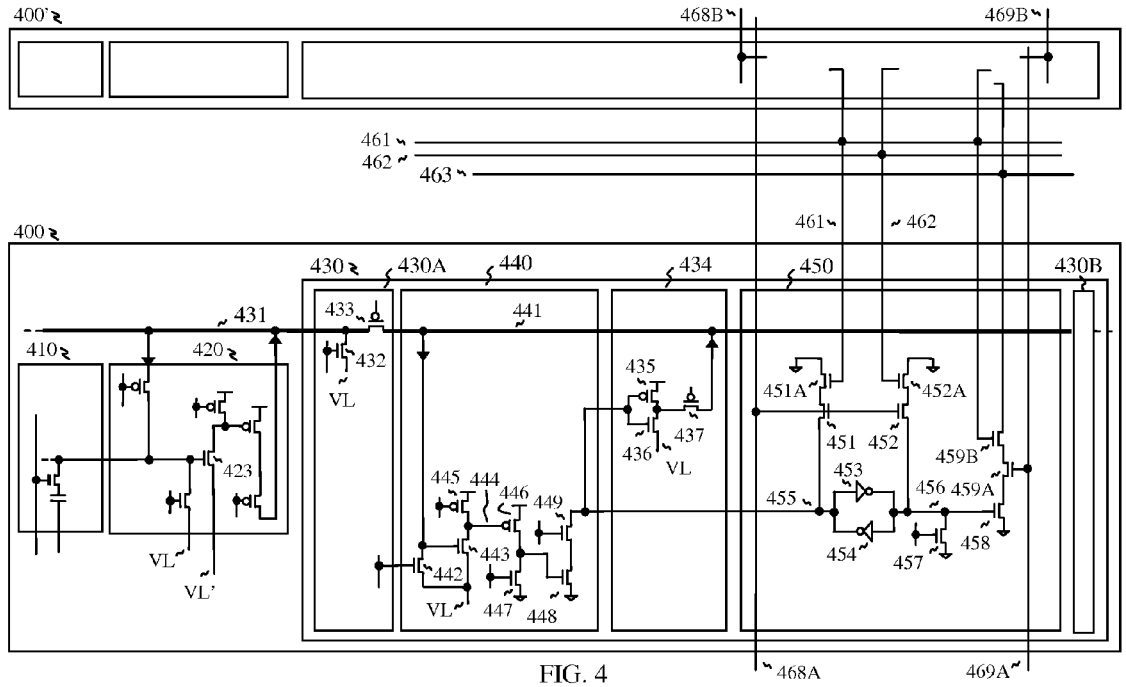
FIG. 4 illustrates an alternative configuration for improving read operation, according to the teachings of the present invention.

In FIG. 4, an alternative configuration for improving read operation is illustrated, wherein a memory block 400 comprises a memory cell 410, a local sense amp 420, and a global sense amp 430 which serves as the read-write circuit. The memory cell 410 and the local sense amp 420 are the same circuit as FIG. 2A. But, source of the local amplify transistor 423 is connected to VL' voltage which is slightly lower voltage than VL voltage, such that the local amplify transistor 423 can flow more current when reading data "1". For example, VL' voltage is 0.1V lower than VL voltage for enhancing the sensitivity, as an alternative configuration.

The global sense amp 430 is slightly modified from that of FIG. 2A, for flipping a latch node 455 with NMOS pull-down transistors 448 and 449, wherein the global sense amp serving as the read-write circuit 430 includes a read circuit 440, a latch circuit 450, a write circuit 434, a left select circuit 430A and a right select circuit 430B, and those circuits are connected to a common line 441, where the left select circuit 430A and the right select circuit 430B are connected to a left global bit line 431 and a right global bit line respectively, for connecting to multiple local sense amps (not shown). In the configuration, the left select circuit 430A is composed of a global pre-charge transistor 432 for pre-charging the left global bit line 431 to the pre-charge voltage VL and a global select transistor 433 for selecting the left global bit line 431, and the right select circuit 430B is composed of the same circuit as the left select circuit.

And the read circuit 440 with NMOS pull-down transistors 448 and 449 is composed of the common pre-charge transistor 442 for pre-charging the common line 441 to the pre-charge voltage VL, the global pre-amp transistor 443 connecting to the global pre-amp node 444 for reading the common line 441, the global pre-set transistor 445 for pre-setting the global pre-amp node 444, in particular, a global middle-amp transistor 446 for reading to the global pre-amp node 444, a global main reset transistor 447 for resetting a global main-amp node which is connected to the global middle-amp transistor 446, and the global main-amp transistor 448 for reading the global main-amp node 444 when the global amp enable transistor 449 is enabled. And the global amp enable transistor 449 is connected to the left latch node 455 as a negative latch node. And the pre-charge voltage VL is generated by the variable voltage generator (not shown).

And the latch circuit 450 includes a cross coupled inverter latch having inverters 453 and 454, a latch reset transistor 457 for resetting the right latch node 456 as a positive latch node, and a row write transistor pair 451 and 452 is connected to a column write transistor pair 451A and 452A which are controlled by a column control line pair 461 and 462 (in column direction). When writing data "1", the negative latch node 455 is pulled down by the series transistors 451 and 451A because a current path is set up by turning on the column write transistor 451A, while the row write transistor 451 is enabled by the row write signal 468A and the column control line 461 is asserted to high. But the other series transistors 452 and 452A are not set up a current path to the positive latch node 456 because the other column control line 462 keeps low, which turns off the other column write transistor 452A.

And the write circuit 434 receives an output from the cross coupled inverter latch for driving the common line 441, wherein the write circuit 434 includes an inverter having a pull-up transistor 435 and a pull-down transistor 436. And the pull-down transistor 436 is supplied by the voltage VL, and a write enable transistor 437 receives an output of the inverter and drives the common line 441 during write operation.

For reading, a read data line 463 in column direction is connected to a read path including a read amplify transistor 458 which is enabled by a row read transistor 459A with a row enable signal 469A and a column read transistor 459B with the column control line 461. When the memory block 400 is selected, a read data from selected memory block 400 reads a read data through the read path, but another memory block 400' is not selected because another row enable signal 469B keeps low even though the column control line 461 is common in the column direction. Similarly, a write data is not transferred to another memory block 400' when the row write signal 468B is not asserted during write operation.

In FIG. 5, an alternative configuration with NMOS pull-down transistors for connecting to the latch node is illustrated, wherein the NMOS pull-down transistors can strongly pull down a latch node of the latch circuit, when reading data "1".

More specifically, the global sense amp serving as the read-write circuit includes a read circuit 540, a latch circuit 550, a write circuit 534, a left select circuit 530 and a right select circuit 538, and those circuits are connected to a common line 541, where the left select circuit 530 and the right select circuit 538 are connected to a left global bit line 531 and a right global bit line 531' respectively, for connecting to multiple local sense amps (not shown). In the configuration, the left select circuit 530 is composed of a global pre-charge transistor 532 for pre-charging the left global bit line 531 to the pre-charge voltage VL and a global select transistor 533 for selecting the left global bit line 531, and the right select circuit 538 is composed of the same circuit as the left select circuit. And the read circuit 540 includes a common line pre-charge transistor 542 for pre-charging the common line 541 to the pre-charge voltage VL, a global pre-amp transistor 543 connecting to a global pre-amp node 544 for reading the common line 541, a global pre-set transistor 545 for pre-setting the global pre-amp node 544, a global middle-amp transistor 546 connecting to the global pre-amp node 544 for transferring a read output from the global pre-amp including transistors 543 and 544 to a global main-amp, wherein strong NMOS pull-down transistors are used for the global main amp, which can easily flip a left latch node 555 as a negative latch node when reading data "1". And the global main-amp is composed of a global main-amp reset transistor 547 for resetting the global main-amp node 544 which is connected to an input of a global main-amp transistor 548 for transferring a read output from the global middle-amp including the global middle-amp transistor 546, when a global amp enable transistor 549 is enabled. And the global amp enable transistor 549 is connected to the right latch node 556 as a positive latch node. And the pre-charge voltage VL is generated by a variable voltage generator 589.

And the latch circuit 550 includes a cross coupled inverter latch having inverters 553 and 554 for connecting a pair of latch nodes 555 and 556, a latch reset transistor 557 for resetting one of the latch nodes, a pair of write transistors 551 and 552 for connecting to a pair of write data lines 566 and 567 for writing, and a read amplify transistor 558 for reading one of the latch nodes, when a column read transistor 559 is enabled.

In addition, the latch circuit 550 is connected to a data write circuit 260 for overwriting a data in the cross coupled inverter latch of the latch circuit through the pair of write data lines 566 and 567, and a data read circuit 570 for reading an output of the cross coupled inverter latch of the latch circuit through a read data line 557. More specifically, the data write circuit 260 includes an inverting write tri-state inverter 562 and a non-inverting write tri-state inverter 563 for driving the pair of write data lines 566 and 567, a pre-charge transistor 564 and a reset transistor 565 for pre-setting and resetting the pair of write data lines. More detailed operation will be explained as below.

And the write circuit 534 receives an output from the cross coupled inverter latch having inverters 553 and 554 for driving the common line 541, wherein the write circuit 534 includes an inverter having a pull-up transistor 535 and a pull-down transistor 536. And the pull-down transistor 536 is supplied by the voltage VL, and a write enable transistor 537 receives an output of the inverter and drives the common line 541 during write operation. For reading, a read data line 575 is connected to the read amplify transistor 558 which is enabled by the column read transistor 559, where the column read transistor 559 is enabled by a column read signal 569.

And the global amp enable transistor 549 is connected to a locking signal 597, such that the global amp enable transistor 549 is disabled after a read output from the memory cell is reached to the latch circuit 550. And the locking signal 597 is generated by a locking signal generator 590, wherein the locking signal generator 590 is composed of an AND gate 593 for receiving an output from the latch circuit 550, a tunable delay circuit 594 (as shown in FIG. 6A) for delaying the read output of the latch circuit 550, an inverter 595 for inverting the delayed output, and another AND gate 596 for generating the locking signal 597, while a global read enable signal 591 is asserted to high. The locking signal 597 is generated as long as one of reference memory cells works correctly. In order to generate the locking signal, a reference signal is generated by at least a reference global sense amp comprising the read circuit 540, the latch circuit 550, the write circuit 534, the left select circuit 530 and the right select circuit 538. Similarly, main global sense amp is composed of a read circuit 540', a latch circuit 550', a write circuit 534', a left select circuit 530' and a right select circuit 538'. Furthermore, there are numerous main global sense amps in the columns, even though only one main global sense amp is drawn in the figure.

During read operation, a stored data in the memory cell is transferred to the latch circuit 550 through the sense amps, for instance, high data is transferred to the latch circuit by the local sense amp and the global sense amp with high gain, but low data is not transferred with low gain because the global amp enable transistor 549 connecting to the latch circuit 550 is disabled by the locking signal 597 which is based on high data, before low data is arrived. Furthermore, the latch circuit is also used for write-back operation when the memory cell is accessed because the stored data in the memory cell is destructed by the charges of the local bit line when reading.

After the stored data is reached to the latch circuit 550, a column read signal 569 is asserted to high, so that the read output is transferred to the data read circuit 570 through the read data line 575. When reading data "1", a positive latch node 556 is raised to high from a reset state because the negative latch node 555 is pulled down by the read circuit 540. Hence a read data line 575 is discharged to VSS voltage by the read amplify transistor 558 while the read enable transistor 559 is turned on by asserting the column read signal 569. By discharging the read data line 575, the data output 588 is raised to high through the inverting buffers including 572, 582, 583, 585 and 587, while the read tri-state inverter 582 is turned on but the bypass tri-state inverter 581 is turned off in a data switch circuit 580. However, data output 588 keeps low when reading data "0", because the read data line 575 is not discharged while the positive latch node 556 keeps reset state, which turns off the read amplify transistor 558 even though the read enable transistor 559 is turned on. Hence, the read data line 575 is maintained to VDD voltage by a cross inverter latch including inverters 572 and 573, where a reset transistor 574 is used for resetting the cross coupled inverter latch during standby. When the memory block is not selected, the positive latch node 556 is reset to VSS voltage by the latch reset transistor 557, which turns off the read amplify transistor 558. Thus, there is no discharge path from the unselected memory block even though the read enable transistor is controlled in column direction, while the read data line 575 is pre-charged to supply voltage VDD, because the read data line 575 is pre-charged to VDD voltage by a pre-charge transistor 571 while unselected.

During write operation, a data write circuit 560 is activated, such that an inverting write tri-state inverter 562 and a non-inverting write tri-state inverter 563 are enabled for driving the write data line pair 566 and 567, while a pre-charge transistor 564 and a reset transistor 565 are turned off. When writing data "1", the positive latch node 556 is raised to high by forcing the data input 561 to high, such that the non-inverting write tri-state inverter 563 drives the positive data line 567 to high while the column write transistor 552 is turned on, and the inverting write tri-state inverter 562 drives the negative data line 566 to low while the column write transistor 551 is turned on. In contrast, the positive data line 567 is driven to low, and the negative data line 566 is driven to high, when writing data "0".

In FIGS. 6A, 6B, 6C and 6D, example layout for the local sense amp 620 including a PMOS write transistor is illustrated, wherein the local sense amp 620 includes poly gate 622 as the local pre-charge transistor, poly gate 623 as the local pre-amp transistor, poly gate 628 as the PMOS write transistor, poly gate 625 as the local pre-set transistor, poly gate 626 as the local main-amp transistor, and poly gate 627 as the local select transistor. The local pre-charge transistor and the local pre-amp transistor are connected to the pre-charge voltage VL. NMOS transistors 622 and 623 are composed of n+active region on p-well region (PW), and PMOS transistors 625, 626, 627 and 628 are composed of p+active region on n-well region (NW), as shown in FIG. 6A. And metal-1 (M1) region and via-1 (VA1) region are defined as shown in FIG. 6B, such that metal-1 bit line 621 is connected to the local pre-charge transistor 622 and the local pre-amp transistor 623 (in FIG. 6A), and metal-1 region 624 serves as the local pre-amp node which is shared by adjacent local sense amp in the right side (not shown). And in FIG. 6C, metal-2 (M2) region is defined, such that the local bit line 621 is jumped over the pre-charge line VL (in FIG. 6B), and the global bit line 631 is connected to the PMOS write transistor 628 through the metal-2 (M2) region. And the local select signal 627A is connected to the gate of the local select transistor 627. In FIG. 6D, metal-3 region as the global bit line 631 are defined for connecting to drain node of the write transistor 628 and drain node of the local select transistor 627 via metal-2 and other layers.

In FIG. 6E, an equivalent circuit of the local sense amp 620 is illustrated, wherein the local sense amp 620 includes the PMOS write transistor 628, the local pre-charge transistor 622, the local pre-amp transistor 623, the local pre-set transistor 625 connecting to the local pre-amp node 624, the local main-amp transistor 626, and the local select transistor 627. A memory cell 610 is connected to the (right) local bit line 621, and another memory cell is connected to the (left) local bit line, where node numbers are the same as FIG. 6A to 6D for ease of understanding.

In FIG. 7A to 7F, example layout for the read-write circuit is illustrated. For ease of understanding, the global sense amp as the read-write circuit is depicted as shown in FIG. 7A again, where the read-write circuit is the same circuit as shown in FIG. 5, such that the read-write circuit is composed of the read circuit 740, the latch circuit 750, the write circuit 734, the left select circuit 730 and the right select circuit 738, and those circuits are connected to a common line 741, where the left select circuit 730 and the right select circuit 738 are connected to a left global bit line 731 and a right global bit line, respectively, for connecting to multiple local sense amps (not shown). In the configuration, the left select circuit 730 is composed of a global pre-charge transistor 732 for pre-charging the left global bit line 731 to the pre-charge voltage VL and a global select transistor 733 for selecting the left global bit line 731, and the right select circuit 738 is composed of the same circuit as the left select circuit. And the read circuit 740 includes a common pre-charge transistor 742 for pre-charging the common line 741 to the pre-charge voltage VL, a global pre-amp transistor 743 connecting to a global pre-amp node 744 for reading the common line 741, a global pre-set transistor 745 for pre-setting the global pre-amp node 744, a global middle-amp transistor 746 connecting to the global pre-amp node 744 for transferring a read output from the global pre-amp including transistors 743 and 745 to a global main-amp, wherein strong NMOS pull-down transistors are used for the global main amp, which can easily flip a left latch node 755 as a negative latch node when reading data "1". And the global main-amp is composed of a global main-amp reset transistor 747 for resetting the global main-amp node 744 which is connected to an input of a global main-amp transistor 748 for transferring a read output from the global middle-amp including the global middle-amp transistor 746, when a global amp enable transistor 749 is enabled. And the global amp enable transistor 749 is connected to the right latch node 756 as a positive latch node.

And the latch circuit 750 includes a cross coupled inverter latch having inverters 753 and 754, a latch reset transistor 757, and a column write transistor pair 751 and 752 (in column direction) connecting to a data line pair 766 and 767 (in row direction) for writing data, where the column write transistor pair 751 and 752 is selected by a column write enable signal 768. And the write circuit 734 receives an output from the cross coupled inverter latch for driving the common line 741, wherein the write circuit 734 includes an inverter having a pull-up transistor 735 and a pull-down transistor 736. And the pull-down transistor 736 is supplied by the voltage VL, and a write enable transistor 737 receives an output of the inverter and drives the common line 741 during write operation. For reading, a read data line 775 is connected to a read amplify transistor 758 which is enabled by a read enable transistor 759, where the read enable transistor 759 is selected by a column read enable signal 769. And, adjacent global sense amp is composed of the read circuit 740', the latch circuit 750', the write circuit 734', the left select circuit 730' and the right select circuit 738'.

Figure 7A:
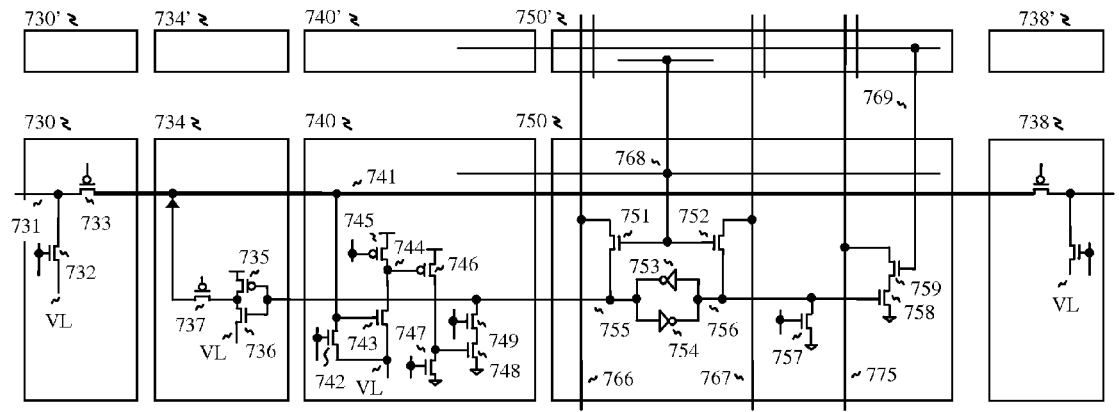
FIGS. 7A, 7B, 7C, 7D, 7E and 7F illustrate example layout for the read-write circuit, according to the teachings of the present invention.
Figure 7B:
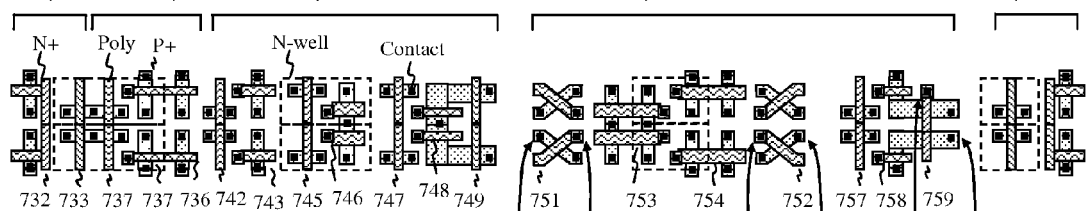
Figure 7C:
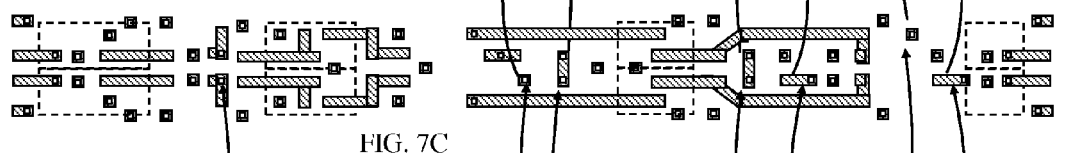
Figure 7D:
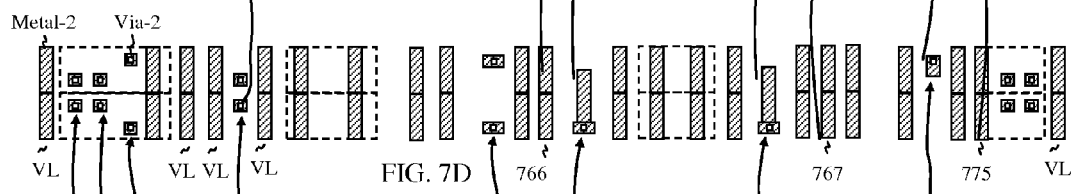
Figure 7E:
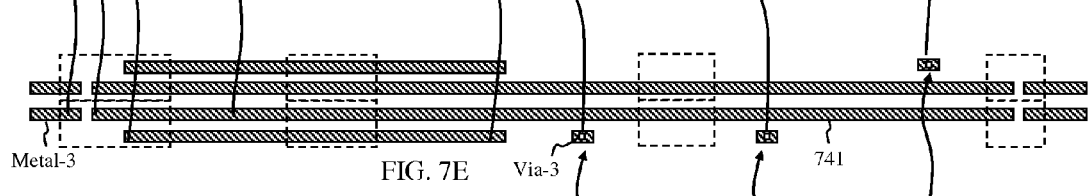
Figure 7F:
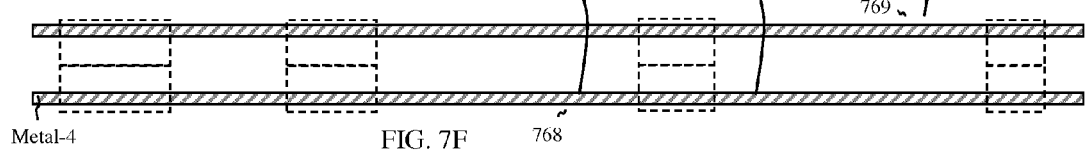

In FIG. 7B, base regions are illustrated, wherein N+ region is formed on the substrate, P+ region is formed on the N-well region (which is broken line), poly gate region is formed on the active region including N+ region and P+ region, and contact region is defined on the active region and poly region. And the global pre-charge transistor 732 is formed on the N+ region as an example, and other transistors are marked as the same number as shown in FIG. 7A, for ease of understanding. In FIG. 7C, metal-1 region is defined on the contact region (shown in FIG. 7B). And via-1 region is defined on the metal-1 region. In FIG. 7D, metal-2 region is defined on the via-1 region (shown in FIG. 7C). And via-2 region is defined on the metal-2 region. The drawing shows that (metal-2) write data lines 766 and 767 are connected to the transistors 751 and 752, respectively. And also the (metal-2) read data line 775 is connected to the read select transistor 777 (shown in FIG. 7A). In FIG. 7E, metal-3 region is defined on the via-2 region. And via-3 region is defined on the metal-3 region, wherein the common line 741 is formed on the via-2 region. And in FIG. 7F, metal-4 region is defined on the via-3 region (shown in FIG. 7E) for connecting the column write enable signal 778 and the column read enable signal 779. As shown in the example layout, the common line is useful for realizing a layout more effectively within a limited pitch, and also reducing area of the layout. And the read-write circuit is efficiently connected to a local sense amp in the short bit line memory architecture for reading and writing data.

Figure 8A:
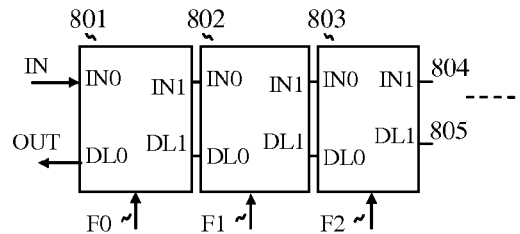
FIG. 8A illustrates a tunable delay circuit.
Figure 8B:
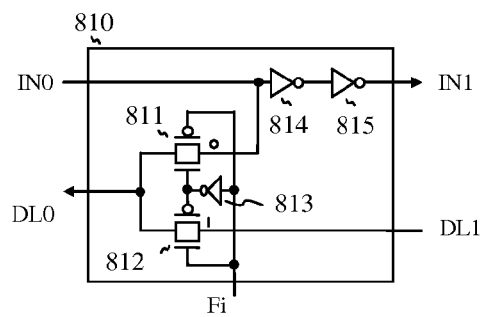
FIG. 8B illustrates a delay unit of the tunable delay circuit.

In FIG. 8A, more detailed a tunable delay circuit (as shown 294 in FIG. 2A) is illustrated, wherein multiple delay units 801, 802 and 803 are connected in series, the first delay unit 801 receives input IN and generates output OUT, the second delay unit 802 is connected to the first delay unit, and the third delay unit 803 is connected to the second delay unit 802 and generates outputs 804 and 805, and so on. Each delay unit receives a fuse signal, such that the first delay unit receives F0, the second delay unit receives F1, and a third delay unit receives F2. And more detailed delay unit is illustrated in FIG. 8B, wherein the delay unit 810 receives an input IN0 and a fuse signal Fi, thus the fuse signal Fi selects output from the input IN0 or input DL1, so that a transfer gate 811 is turned on when the fuse signal Fi is low and output of inverter 813 is high, otherwise another transfer gate 812 is turned on when the fuse signal Fi is high and output of inverter 813 is low to bypass DL1 signal. Inverter chain 814 and 815 delays IN0 signal for the next delay unit, where more inverter chains or capacitors can be added for the delay even though the drawing illustrates only two inverters.

Figure 8C:
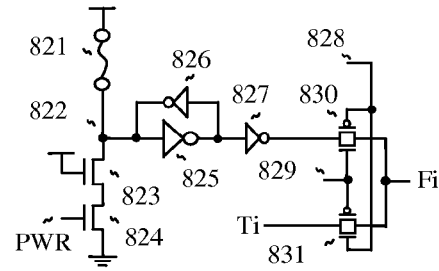
FIG. 8C illustrates a related fuse circuit for the tunable delay circuit.

In FIG. 8C, a related fuse circuit of the tunable delay circuit (as shown in FIG. 8A) is illustrated in order to store information for the delay circuit, so that a fuse serves as a nonvolatile memory, wherein a fuse 821 is connected to a latch node 822, a cross coupled latch including two inverters 825 and 826 are connected to the latch node 822, pull-down transistors 823 and 824 are serially connected to the latch node 822 for power-up reset. Transfer gate 830 is selected by a select signal 829 (high) and another select signal 828 (low) in order to bypass the latch node output 822 through inverter 825 and 827. In doing so, fuse data is transferred to output node Fi, otherwise test input Ti is transferred to Fi when a transmission gate 831 is turned on.

Figure 8D:
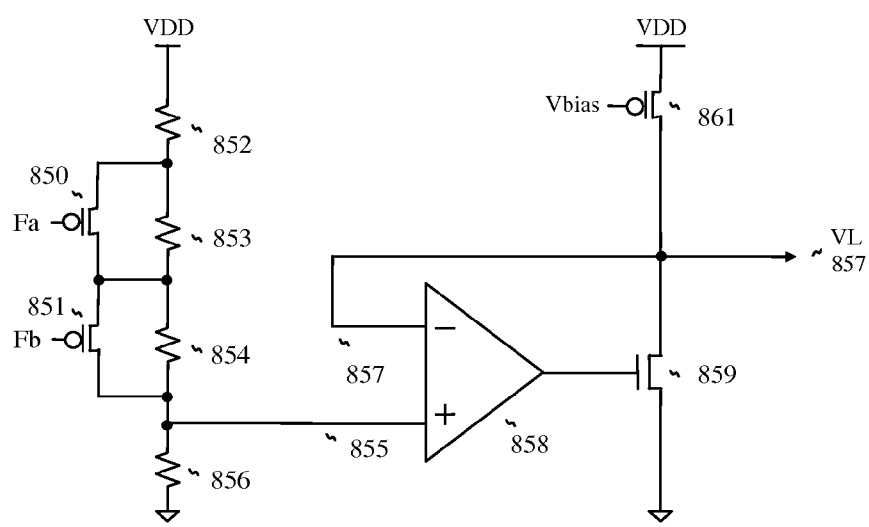
FIG. 8D illustrates a variable voltage regulator for supplying variable voltage to the sense amps.

In FIG. 8D, a variable voltage regulator is illustrated for supplying variable voltage VL to the reduced swing amplifiers, wherein a reference voltage 855 is generated by a variable voltage reference circuit, such that a first resistor 852 is connected to a second resistor 853, the second resistor 853 is connected to a third resistor 854, and the third resistor 854 is connected to a fourth resistor 856, serially. Hence, the supply voltage VDD is reduced to the reference voltage output 855 by the ratio of the resistance value. And the reference voltage output 855 is tunable with turn-on or turn-off state of the transistors 850 and 851. In addition, the transistors are controlled by control signals Fa and Fb, respectively. And the control signals Fa and Fb are generated by the fuse circuit as shown in FIG. 8C, where turn-on resistance of the transistor is much smaller than the resistance value of the resistor. And the reference voltage 855 is buffered by an op amp 858, so that the variable voltage VL is generated by the op amp 858 and a big driver transistor 859. Generally, a voltage difference between two op amp inputs 855 and 857 is equal or very close. In doing so, the variable voltage output VL is almost equal to the reference voltage 855. And a weak current sink transistor 861 is connected to the VL voltage output 857 for stabilizing the output, wherein the current sink transistor 861 is controlled by a bias voltage Vbias.

While the descriptions here have been given for configuring the memory circuit and structure, alternative embodiments would work equally well with reverse configuration, such that PMOS transistor can be used as the pass transistor. Other circuits including the local sense amp and the global sense amp are reversed. And signal polarities are also reversed to control the reverse configuration.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
a read-write circuit serving as a global sense amp, wherein the read-write circuit includes a common line for connecting to its component circuits having a read circuit, a latch circuit, a write circuit, and at least a select circuit, such that the read circuit includes a common pre-charge transistor for pre-charging the common line to a pre-charge voltage, a global pre-amp transistor for reading the common line, a global pre-set transistor for pre-setting a global pre-amp node connecting to the global pre-amp transistor, and a global main-amp transistor for reading to the global pre-amp node when a global amp enable transistor is enabled; and the latch circuit includes a cross coupled inverter latch connecting a pair of latch nodes, a latch reset transistor for resetting one of the latch nodes, and a pair of series transistors having a row select transistor pair for connecting to the pair of the latch nodes and a column select transistor pair for connecting to a pair of data lines; and the write circuit includes an inverter receiving one of the latch nodes, and a write enable transistor receiving an output of the inverter and driving the common line, where the inverter is composed of a pull-up transistor and a pull-down transistor which is supplied by a variable voltage source; and the select circuit is composed of a global pre-charge transistor for pre-charging a global bit line to the pre-charge voltage and a global select transistor for connecting the global bit line to the common line; and a local sense amp including a local pre-charge transistor for pre-charging a local bit line to the pre-charge voltage, a local pre-amp transistor for connecting to a local pre-amp node, a local pre-set transistor for pre-setting the local pre-amp node, a local main-amp transistor for reading to the local pre-amp node when a local amp enable transistor is enabled; and a write transistor is connected to the local bit line for connecting to the global bit line; and a memory cell connecting to the local bit line, wherein the memory cell is composed of a pass transistor and a capacitor for configuring a dynamic random access memory; and a variable voltage regulator for generating the pre-charge voltage as the variable voltage source; and a delay circuit for generating a delayed signal which disables the global enable transistor when reading.

2. The memory device of claim 1, wherein the read circuit is composed of the common pre-charge transistor for pre-charging the common line to the pre-charge voltage, the global pre-amp transistor connecting to the global pre-amp node for reading the common line, the global pre-set transistor for pre-setting the global pre-amp node, in particular, a global middle-amp transistor for reading to the global pre-amp node, a global main reset transistor for resetting a global main-amp node which is connected to the global middle-amp transistor, and the global main-amp transistor for reading the global main-amp node when the global amp enable transistor is enabled.

3. The memory device of claim 1, wherein the latch circuit includes a cross coupled inverter latch connecting a pair of latch nodes, a latch reset transistor for resetting one of the latch nodes, and a pair of write series transistors having a row write transistor pair for connecting to the pair of the latch nodes and a column write transistor pair for connecting to a pair of data lines, and a read amplify transistor for reading one of the latch nodes, when a row read transistor and a column read transistor are enabled.

4. The memory device of claim 1, wherein the latch circuit includes a cross coupled inverter latch connecting a pair of latch nodes, a latch reset transistor for resetting one of the latch nodes, and a pair of write transistors for connecting to a pair of write data lines; and a read amplify transistor for reading one of the latch nodes, when a column read transistor is enabled.

5. The memory device of claim 1, wherein the latch circuit is connected to a data write circuit for overwriting a data in the cross coupled inverter latch of the latch circuit through a write data line pair, and a data read circuit for reading an output of the cross coupled inverter latch of the latch circuit through a read data line; more specifically, the data write circuit includes an inverting write tri-state inverter and a non-inverting write tri-state inverter for driving the write data line pair, a pre-charge transistor and a reset transistor for pre-setting and resetting the write data line pair.

6. The memory device of claim 1, wherein the variable voltage regulator generates a pre-charge voltage, such that fuse circuits are used for setting voltage level of the variable voltage regulator.

7. The memory device of claim 1, wherein the delay circuit includes tunable delay elements for adjusting delay time, and the tunable delay elements are set by fuse circuits.

* * * * *